United States Patent
Hackl

(10) Patent No.: US 10,805,752 B2
(45) Date of Patent: Oct. 13, 2020

(54) OPTIMIZING JOINT OPERATION OF A COMMUNICATION DEVICE AND AN ACCESSORY DEVICE COUPLED THERETO

(71) Applicant: SAVOX COMMUNICATIONS OY AB (LTD), Espoo (FI)

(72) Inventor: Daniel Patrick Hackl, Vancouver (CA)

(73) Assignee: SAVOX COMMUNICATIONS OY AB (LTD), Espoo (FI)

(*) Notice: Subject to any disclaimer, the term of this patent is extended or adjusted under 35 U.S.C. 154(b) by 7 days.

(21) Appl. No.: 16/312,537

(22) PCT Filed: Jun. 22, 2017

(86) PCT No.: PCT/FI2017/050471
§ 371 (c)(1),
(2) Date: Dec. 21, 2018

(87) PCT Pub. No.: WO2017/220866
PCT Pub. Date: Dec. 28, 2017

(65) Prior Publication Data
US 2020/0037090 A1    Jan. 30, 2020

(30) Foreign Application Priority Data
Jun. 23, 2016 (FI) .................................... 20165517

(51) Int. Cl.
*H04R 29/00* (2006.01)
*H03G 5/16* (2006.01)
(Continued)

(52) U.S. Cl.
CPC ........... *H04R 29/007* (2013.01); *H03G 5/165* (2013.01); *H04R 5/04* (2013.01); *H04R 25/554* (2013.01);
(Continued)

(58) Field of Classification Search
None
See application file for complete search history.

(56) References Cited

U.S. PATENT DOCUMENTS

2002/0072816 A1    6/2002    Shdema et al.
2006/0046651 A1    3/2006    Hazell et al.
(Continued)

FOREIGN PATENT DOCUMENTS

EP    2 706 662 A2    3/2014

OTHER PUBLICATIONS

FI Search Report, dated Jan. 13, 2017, from corresponding FI20165517 application.
(Continued)

*Primary Examiner* — Paul W Huber
(74) *Attorney, Agent, or Firm* — Nixon & Vanderhye

(57) ABSTRACT

Disclosed is a method for operating an arrangement of a mobile communication device that includes an audio processor communicatively coupled to an accessory device that includes an audio transducer is provided, the method including adjusting at least one operating parameter in one or both of the audio processor and the audio transducer, the adjusting including obtaining, via the communicative coupling from the accessory device, an accessory type identification assigned for the accessory device, obtaining a device type identification assigned for the mobile communication device, selecting a respective predefined value for each of the at least one operating parameter in dependence of the obtained accessory type identifier and the device type identifier, and setting each of the at least one operating parameter into respective selected values for subsequent operation of the arrangement.

19 Claims, 2 Drawing Sheets

(51) Int. Cl.
  *H04R 5/04* (2006.01)
  *H04R 25/00* (2006.01)
  *H04W 8/00* (2009.01)
  *H04W 88/02* (2009.01)
  *H04M 1/60* (2006.01)

(52) U.S. Cl.
  CPC ........... *H04W 8/005* (2013.01); *H04W 88/02* (2013.01); *H04M 1/6058* (2013.01); *H04R 2225/55* (2013.01); *H04R 2420/03* (2013.01); *H04R 2499/11* (2013.01)

(56) References Cited

U.S. PATENT DOCUMENTS

| | | |
|---|---|---|
| 2007/0155332 A1 | 7/2007 | Burgan et al. |
| 2009/0191914 A1 | 7/2009 | Stahl |
| 2010/0189272 A1 | 7/2010 | Song et al. |
| 2010/0227631 A1* | 9/2010 | Bolton .................. H04L 51/24 455/466 |
| 2011/0191103 A1 | 8/2011 | Shin et al. |
| 2015/0055789 A1 | 2/2015 | Bernal et al. |
| 2016/0085566 A1 | 3/2016 | Benzaia et al. |

OTHER PUBLICATIONS

International Search Report, dated Aug. 18, 2017, from corresponding PCT/FI2017/050471 application.

* cited by examiner

200

210
Operate an arrangement comprising a mobile communication device that comprises an audio processing means and an accessory device taht comprises an audio transducer means, where the two devices are communciatively coupled to each other

220
Adjust at least one operating parameter in one or both of the audio processing means and the audio transducer means

230
Obtain, from the accessory device, an accessory type identification assigned therefor

240
Obtain a device type identification assigned for the communication device

250
Select a respective predefined value for each of said at least one operating parameter in dependence of the obtained accessory type identifier and the device type identifier

260
Set each of said at least one operating parameter into respective selected values for subsequent operation of the arrangement

Figure 2

OPTIMIZING JOINT OPERATION OF A COMMUNICATION DEVICE AND AN ACCESSORY DEVICE COUPLED THERETO

TECHNICAL FIELD

The present invention relates to joint setting of operating parameters in a mobile communication device and an accessory device connectable thereto in order to improve performance of the pair of mobile communication device and the accessory device as a combination.

BACKGROUND

Modern mobile communication devices typically provide a possibility to connect thereto accessory devices that extend the functionality of the mobile communication device and/or enable improved user experience or user comfort when accessing some functions of the mobile communication device. In order to serve such purpose, an accessory device may be communicatively coupled to the mobile communication device using a wired or wireless connection that enables transfer of information from the mobile communication device to the accessory device and/or from the accessory device to the mobile communication device, depending on characteristics of the accessory device and or its intended use with the mobile communication device.

Typically, an accessory device is communicatively coupled to the mobile communication device via an interface that exhibits predefined, possibly standardized, electrical and mechanical characteristics. This is very useful in enabling accessory devices of various types and/or various manufacturers to interface the mobile communication device. On the other hand, although the electrical and mechanical characteristics of the interface between the mobile communication device and the accessory device may be predefined ones that ensures establishing the connection between the two devices, it may not be enough to guarantee reliable transfer of information and/or expected quality of join operation of the mobile communication device and the accessory device. Partly due to this reason, in many scenarios additional steps of configuring some operating characteristics of the mobile communication device and/or the accessory device may be required in order to adjust the devices to operate together in a meaningful manner or even to enable the joint operation in general.

The configuration procedure, in turn, may involve tasks that are beyond the skills of a typical user of the mobile communication device and that may be cumbersome to carry out due to limited user interface capabilities, especially in the accessory device. Consequently, there are potential points of failure in making the mobile communication device and the accessory device to jointly carry out the intended function at the expected quality.

SUMMARY

Therefore, it is an object of the present invention to provide a technique that facilitates the mobile communication device and the accessory device connected thereto operate jointly up to their potential.

According to an example embodiment, an arrangement of a mobile communication device that comprises an audio processing means communicatively coupled to an accessory device that comprises an audio transducer means is provided, wherein the mobile communication device comprises a control means for adjusting at least one operating parameter in one or both of the audio processing means and the audio transducer means, the control means arranged to obtain, via the communicative coupling from the accessory device, an accessory type identification assigned for the accessory device, obtain a device type identification assigned for the mobile communication device, select a respective predefined value for each of said at least one operating parameter in dependence of the obtained accessory type identifier and the device type identifier, and set each of said at least one operating parameter into respective selected values for subsequent operation of the arrangement.

According to another example embodiment, a method for operating an arrangement of a mobile communication device that comprises an audio processing means communicatively coupled to an accessory device that comprises an audio transducer means is provided, the method comprising adjusting at least one operating parameter in one or both of the audio processing means and the audio transducer means, said adjusting comprising obtaining, via the communicative coupling from the accessory device, an accessory type identification assigned for the accessory device, obtaining a device type identification assigned for the mobile communication device, selecting a respective predefined value for each of said at least one operating parameter in dependence of the obtained accessory type identifier and the device type identifier, and setting each of said at least one operating parameter into respective selected values for subsequent operation of the arrangement.

According to another example embodiment, a computer program is provided, the computer program comprising computer readable program code configured to cause performing at least the method according to the example embodiment described in the foregoing when said program code is executed on a computing apparatus.

The computer program according to an example embodiment may be embodied on a volatile or a non-volatile computer-readable record medium, for example as a computer program product comprising at least one computer readable non-transitory medium having program code stored thereon, the program which when executed by an apparatus cause the apparatus at least to perform the operations described hereinbefore for the computer program according to an example embodiment of the invention.

The exemplifying embodiments of the invention presented in this patent application are not to be interpreted to pose limitations to the applicability of the appended claims. The verb "to comprise" and its derivatives are used in this patent application as an open limitation that does not exclude the existence of also unrecited features. The features described hereinafter are mutually freely combinable unless explicitly stated otherwise.

Some features of the invention are set forth in the appended claims. Aspects of the invention, however, both as to its construction and its method of operation, together with additional objects and advantages thereof, will be best understood from the following description of some example embodiments when read in connection with the accompanying drawings.

BRIEF DESCRIPTION OF FIGURES

The embodiments of the invention are illustrated by way of example, and not by way of limitation, in the figures of the accompanying drawings, where

FIG. 2 illustrates a method according to an example embodiment.

DESCRIPTION OF SOME EMBODIMENTS

Figure 1:
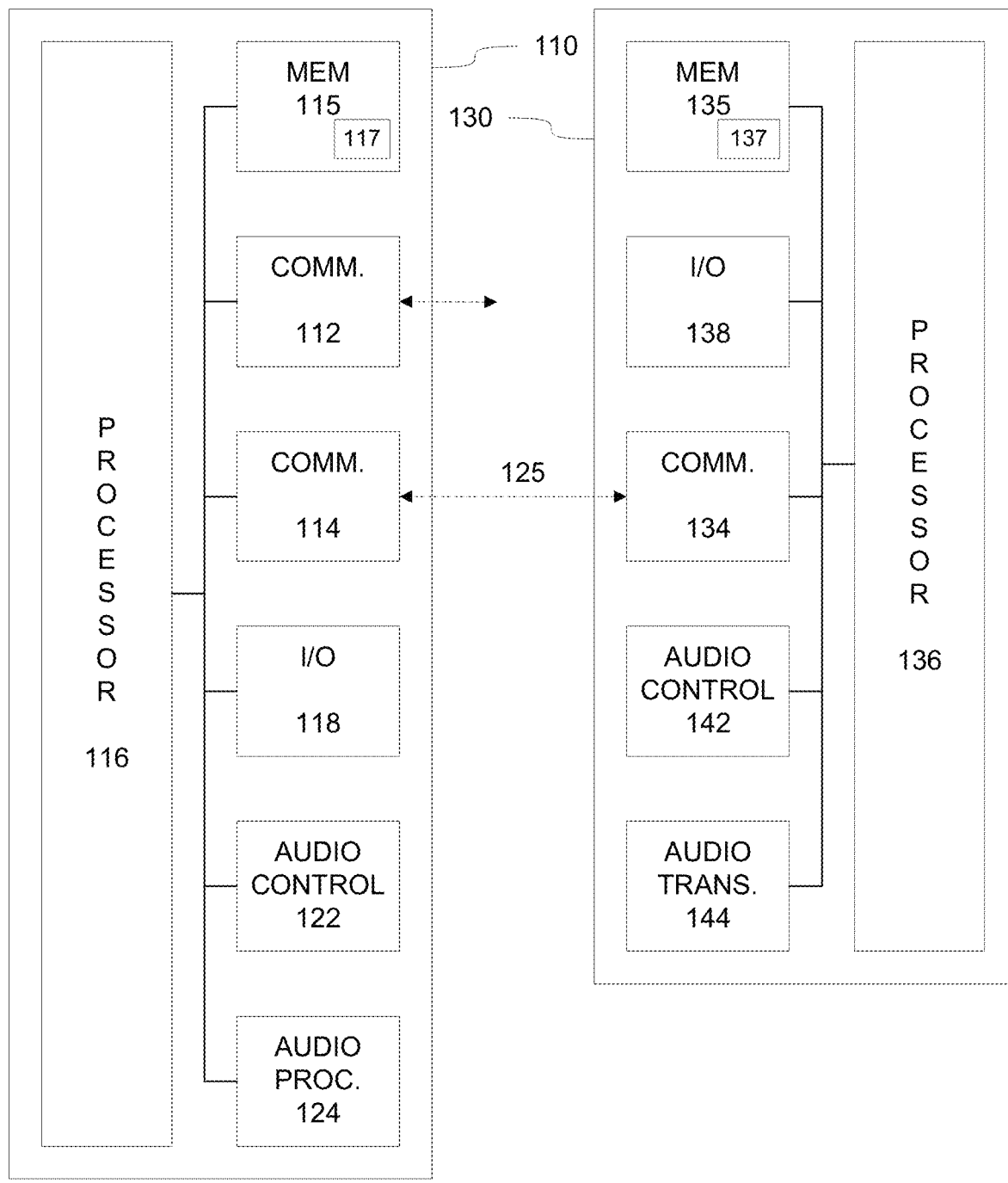
FIG. 1 illustrates respective block diagrams of some components of a mobile communication device and an accessory device that may be jointly applied to provide one or more example embodiments.

FIG. 1 illustrates a block diagram of some components of a mobile communication device 110. The mobile communication device 110 may comprise further components or portions in addition to those depicted in FIG. 1, whereas the ones depicted therein are ones that are considered in description of some embodiments of the present invention. In an example, the mobile communication device 110 is provided as a specific-purpose mobile communication device arranged to serve as a radiotelephone, e.g. as an endpoint of push-to-talk (PTT) communication system. In another example, the mobile communication device 110 is provided as a multi-purpose portable mobile device, such as a mobile phone, a smartphone, a mobile communication device of other type, a gaming device, a media player, a portable navigation device, a tablet computer, a laptop computer, etc. In the following, we refer to the mobile communication device 110 simply as a communication device for brevity of description in this regard.

The communication device 110 comprises a processor 116 and a memory 115 for storing data and computer program code 117. The communication device 110 further comprises user I/O (input/output) components 118 that may be arranged, possibly together with the processor 116 and a portion of the computer program code 117, to provide a user interface for receiving input from a user of the communication device 110 and/or providing output to the user of the communication device 110. The user I/O components 118 may comprise hardware components such as a display, a touchscreen and/or an arrangement of one or more keys or buttons, etc. The user I/O components 118 may be also referred to as peripherals.

The communication device 110 comprises a communication apparatus 112 for wireless communication with other devices over a wireless link. The communication apparatus 112 may be also referred to as (wireless) communication means 112. The communication apparatus 112 may enable, for example, wireless communication with other devices by using a suitable wireless wide area network (WWAN) technique known in the art. An example of a suitable WWAN technique comprises cellular access technology, where the communication apparatus 112 may be employed to establish a wireless link with a base station of a cellular network, which connects the communication device 110 to a core network and/or to a computer network that further enables connecting resources in the network and/or other devices that are connected to the core/computer network.

The communication device 110 further comprises a second communication apparatus 114, which enables wireless communication with other devices by using a wireless communication technique or protocol that enables a point-to-point or a point-to-multipoint wireless connection with another device. Some characteristics of the second communication apparatus 114 and examples of wireless communication techniques applicable therein are discussed later in this text.

The communication device 110 further comprises an audio control means 122 and an audio processing means 124. The audio control means 122 is provided for controlling at least one operation characteristics of the audio processing means 124 and the audio processing means is provided for processing sound signals for transfer via one of the communication apparatuses 112, 114 and/or for processing sound signals transferred via one of the communication apparatuses 112, 114. Herein, the term sound signal is to be construed broadly, representing e.g. a digital audio signal that represents the waveform of a sound signal or an encoded audio signal that comprises a plurality of audio parameters that are descriptive of a sound signal.

The processor 116 may be arranged to provide a control function for controlling operation of the communication device 110 at least in accordance with a portion of the computer program code 117 and possibly further e.g. in accordance with the user input received via the user I/O components 118 and/or in accordance with information received via one or more of the communication apparatuses 112, 114. This control function may be also referred to as control means (of the communication device 110). In an example, at least part of the control function is provided by a software application that, when executed by the processor 116, implements function(s) of the audio control means 122 depicted in FIG. 1 as a dedicated (logical) component of the communication device 110.

FIG. 1 further illustrates an accessory device 130 that is communicatively coupled to the communication device 110. The accessory device 130 comprises a processor 136, a memory 135 for storing data and computer program code 137, and a communication apparatus 134. For each of these blocks, the description provided in the foregoing for the respective block 11x of the communication device 110 applies, mutatis mutandis. The accessory device 130 further comprises a communication apparatus 134, which enables wireless communication with other devices by using a wireless communication technique or protocol that enables a point-to-point or a point-to-multipoint wireless connection with another device, in particular with the communication device 110 via the communication apparatus 114 therein. In this regard, the accessory device 130 may be coupled to the communication device via a link 125.

In an example, the accessory device 130 is provided as an audio accessory comprising an audio control means 142 and an audio transducer means 144. The audio control means 142 is provided for controlling at least one operation characteristics of the audio transducer means 144 and the audio transducer means 144 is provided for at least one of capturing sound signals in the environment of the accessory device 130 and playing back sound signals. The audio control means 142 may be further provided for processing sound signals transferred via the audio transducer means 144.

In an example, the audio transducer means 144 comprises one or more microphones and one or more speakers, and such an audio accessory device may be provided e.g. as a headset. In other examples, the accessory device 130 may comprise one or more microphones but no speakers (e.g. a microphone, an arrangement of two or more microphone or a microphone array) or it may comprise one or more speakers but no microphones (e.g. a loudspeaker, an arrangement of two or more loudspeakers or headphones).

The processor 136 may be arranged to provide a control function for controlling operation of the accessory device 130 at least in accordance with a portion of the computer program code 137 and possibly further e.g. in accordance with the user input received via the user I/O components 138 and/or in accordance with information received via the communication apparatus 134. This control function may be also referred to as control means (of the accessory device 130). In an example, at least part of the control function is provided by a software application that, when executed by the processor 136, implements function(s) of the audio control means 142 depicted in FIG. 1 as a dedicated (logical) component of the accessory device 130.

As an example, the wireless connection between the communication apparatuses 114 and 134 providing the link 125 that enables a communicative coupling between the communication device 110 and the accessory device 130 may be provided by employing a suitable short-range wireless communication technique or protocol. Such a wireless link may also be referred to as a local wireless link. The term short-range wireless communication as used herein refers to a wireless communication technique or protocol that enables typical operating range in the scale of tens of meters, e.g. up to 100 meters. However, especially in an indoor environment, the operating range of such short-range wireless communication technique/protocol may be significantly shorter e.g. due to walls and other stationary structures as well as furniture etc. that are likely to partially block or interfere with the radio communication between the two devices. On the other hand, in favorable conditions in outdoor use the operating range may extend to several hundreds of meters. Examples of such a wireless technique/protocol include the Bluetooth Basic Rate/Enhanced Data Rate (BT BR/EDR) protocol and the Bluetooth Low Energy (BLE) protocol known in the art. A further example of such a wireless technique/protocol include Wireless Local Area Network (WLAN) technology specified e.g. in IEEE 802.11 specifications (where the acronym IEEE stands for the Institute of Electrical and Electronics Engineers) as well as Z-wave and ZigBee. A further example of such a wireless technique/protocol includes Near Field Communication (NFC). However, each of the BT BR/EDR, BLE, WLAN, Z-wave, ZigBee and NFC technologies serve as illustrative and non-limiting examples in this regard, and the description generalizes into any short-range wireless communication technique/protocol.

In a variation of the example of FIG. 1, the link 125 that enables the communicative coupling between the communication device 110 and the accessory device 130 may be provided as a wired link instead of the wireless link enabled by the communication apparatuses 114 and 134. In such a scenario the communication device 110 may be provided without the second communication apparatus 114 and/or the accessory device 130 may be provided without the communication apparatus 134. As an example in this regard, the wired link between the devices 110 and 130 may be provided by a universal serial bus (USB) technology, the communication device 110 and the accessory device 130 hence being provided with respective USB ports for connecting the two by a USB cable.

Regardless of the manner of providing the (wireless or wired) link 125 that enables the communicative coupling between the devices 110 and 130, the link 125 enables transfer of sound signals at least in one direction between the communication device 110 and the accessory device 130 and it may further enable transfer of control information (e.g. commands or requests and possibly also respective responses thereto) at least in one direction between the communication device 110 and the accessory device 130.

In the following we provide non-limiting examples of optimization of joint performance of the accessory device 130 and the communication device. Such optimization may involve adjustment or selection of at least one operating parameter in at least one of the communication device 110 and the accessory device 130. Hence, such optimization may involve one of the following:

Adjusting at least one operating parameter in the accessory device 130 to adapt its operation for optimized performance of an arrangement comprising the accessory device 130 and a communication device 110 of a certain type;

Adjusting at least one operating parameter in the communication device 110 to adapt its operation for optimized performance of an arrangement comprising the communication device 110 and an accessory device 130 of a certain type; and Adjusting at least one operating parameter in the accessory device 130 and at least one operating parameter in the communication device 110 to adapt operation of the devices 110, 130 for optimized performance of an arrangement comprising an accessory device 130 of a (first) certain type and a communication device 110 of a (second) certain type.

In a first example, it is assumed that the audio transducer means 144 in the accessory device 130 comprises a microphone and a microphone preamplifier for amplifying a sound signal captured by the microphone before provision to the communication device 110 via the link 125, where the at least one operating parameter to be adjusted for optimized (joint) performance comprises a microphone preamplifier gain $g_{mic}$. In this regard, the audio control means 142 is arranged to adjust or select the microphone preamplifier gain $g_{mic}$ in accordance with control information (e.g. commands or requests) received from the communication device 110 via the link 125 that connects the accessory device 130 to the communication device 110, thereby enabling adjustment of (perceivable) sensitivity of the microphone from the communication device 110. The adjustment or selection of the gain $g_{mic}$ is carried out under control of the audio control means 122 in dependence of respective types of the communication device 110 and the accessory device 130, as outlined in the following.

This approach allows matching the operation of the audio transducer means 144 with that of the audio processing means 124 for optimized sound quality of the captured sound signal when using the respective combination of the communication device 110 and the accessory device 130. This, in turn, enables adjusting a given accessory device 130 hosting a microphone with adjustable preamplifier gain $g_{mic}$ to operate at optimized sound quality with a number of devices 110 of different audio processing characteristics.

The communication device 110 may be arranged to initiate selection and setting of the gain $g_{mic}$ in response to establishment of the link 125 between communication device 110 and the accessory device 130. This may happen, for example, in response to connecting the accessory device 130 to the communication device 110 when the communication device 110 is in operation, in response to power-up of the communication device 110 with the accessory device 130 connected thereto and/or in response to power-up of the accessory device 130 when already connected to the communication device 110.

The parameter adjustment procedure that involves selecting and setting the gain $g_{mic}$ commences with the communication device 110 obtaining an accessory identification (accessory ID) assigned for the accessory device 130. In an example, the audio control means 122 obtains the accessory ID by transmitting, via the link 125 a request for the accessory device 130 (e.g. to the audio control means 142 therein) to provide the accessory ID assigned therefor and receives the accessory ID from the accessory device 130 via the link 125 in response to the request. In another example, the accessory device 130 (e.g. the audio control means 142 therein) reacts to the establishment of the link 125 with the communication device 110 by automatically transmitting the accessory ID to the communication device 110 via the link 125. The accessory ID comprises an accessory type identification (accessory type ID) that defines the type accessory device 130 as one of a plurality of predefined accessory device types. An accessory device type may define, for example, at least the manufacturer and the model of the accessory device 130. Additionally, the accessory ID may further comprise e.g. a serial number or an identifier of other type that serves as a unique identification of the accessory device 130.

The audio control means 122 in the communication device 110 further obtains a device identifier (device ID) assigned therefor. The device ID assigned for the communication device 110 may be stored e.g. in the memory 115 or in a mass storage device in the communication device 110 and the audio control means 122 may obtain the device ID be reading it from the memory 115. The device ID comprises a device type identification (device type ID) that defines the type communication device 110 as one of a plurality of predefined communication device types. A communication device type may define, for example, at least the manufacturer and the model of the communication device 110. Additionally, the device ID may further comprise e.g. a serial number or an identifier of other type that serves as a unique identification of the communication device 110.

The memory 115 (or a mass storage device in the communication device 110) may store a control parameter database that comprises a plurality of database entries, where, in context of the first example, each database entry comprises at least the following pieces of information:
- an accessory type ID,
- a device type ID, and
- an indication of a predefined microphone preamplifier gain $g_{mic}$ value for this pair of accessory type ID and device type ID.

Hence, the control parameter database stores a respective database entry for a plurality of predefined pairs of the accessory type ID and the device type ID. Once the audio control means 122 has obtained the accessory type ID and the device type ID for the current pair of devices 110 and 130, it searches the control parameter database to identify the database entry that comprises the obtained accessory type ID and the device type ID. The database entry so identified comprises an indication of the predefined value for the gain $g_{mic}$ assigned for this pair of the accessory type ID and the device type ID.

The audio control means 122 then reads the value for the gain $g_{mic}$ from the identified database entry and transfers an indication thereof to the accessory device 130 via the link 125. Upon receiving the indication of the value for the gain $g_{mic}$ from the communication device 110 via the link 125, the audio control means 142 in the accessory device 130 adjusts the microphone preamplifier gain $g_{mic}$ of the audio transducer means 144 accordingly.

A second example is a variation of the first example, with the difference that in the second example the microphone preamplifier that has the adjustable gain $g_{mic}$ is provided in the audio processing means 124 in the communication device 110 instead of being provided in the audio transducer means 144 of the accessory device 130. Consequently, the microphone preamplifier serves to amplify the sound signal received from the accessory device 130 via the link 125 before passing it for further processing in audio processing means 124 and/or other components of the communication device 110. Therefore, in the second example the gain adjustment operation differs from that of the first example in that instead of transferring the indication of the selected predefined value for the gain $g_{mic}$ via the link 125 to the accessory device 130, the audio control means 122 adjusts the microphone preamplifier of the audio processing means 124 to employ the gain $g_{mic}$ so obtained.

In a further variation of the first and/or second examples, both the audio transducer means 144 in the accessory device 130 and the audio processing means 124 in the communication device 110 include respective amplifier component that has an adjustable gain $g_{mic1}$ and $g_{mic2}$, respectively, and the parameter adjustment procedure hence involves selecting and setting the two gains $g_{mic1}$ and $g_{mic2}$. In this variation, the control parameter database stores in each database entry an indication of a respective predefined value for each of the gains $g_{mic1}$ and $g_{mic2}$. Consequently, the database entry identified on basis of the obtained accessory type ID and the device type ID provides access to the respective value for each of the gains $g_{mic1}$ and $g_{mic2}$. The audio control means 122 hence reads the value for the gain $g_{mic1}$ from the identified database entry and transfers an indication thereof to the accessory device 130 via the link 125 for adjustment of the gain $g_{mic1}$ in the amplifier component of the audio transducer means 144 accordingly, as well as reads the value for the gain $g_{mic2}$ from the identified database entry and adjusts the gain $g_{mic2}$ of the amplifier component of the audio processing means 124 accordingly.

In a third example that is, again, a variation of the first example, the audio processing means 124 in the communication device 110 includes an audio equalizer for adjusting the frequency content of a sound signal obtained from the accessory device 130 via the link 125. Hence, in the third example the at least one operating parameter to be adjusted in the accessory device 130 for optimized (joint) performance comprises a microphone preamplifier gain $g_{mic}$ and the at least one operating parameter to be adjusted in the communication device 110 for optimized (joint) performance comprises equalization settings. Consequently, the parameter adjustment procedure involves selecting and setting the gain $g_{mic}$ and the audio equalization settings. The audio equalization according to selected audio equalization settings may be employed to shape the frequency response of the sound signal to account for characteristics of the microphone provided in the audio transducer means 144 of the accessory device 130. The audio equalization may be carried out as known in the art, e.g. by employing a (digital) filter of desired characteristics.

In the third example, the control parameter database stores in each database entry an indication of a predefined value for the gain $g_{mic}$ and predefined audio equalization settings (e.g. filter coefficients for a respective digital filter for filtering the sound signal obtained from the accessory device 130) assigned for the pair of the accessory type ID and the device type ID of the same database entry. Consequently, the database entry identified on basis of the obtained accessory type ID and the device type ID provides access to the value for the gain $g_{mic}$ and for the audio equalization settings. The audio control means 122 hence reads the value for the gain $g_{mic}$ from the identified database entry and transfers an indication thereof to the accessory device 130 via the link 125 for adjustment of the gain $g_{mic}$ in the amplifier component of the audio transducer means 144 accordingly, as well as reads the audio equalization settings from the identified database entry and adjusts the audio equalizer to apply the audio equalization settings so obtained.

In a fourth example it is assumed that the audio transducer means 144 in the accessory device comprises at least one speaker for generating an acoustic signal on basis of a sound signal received from the communication device 110 via the link 125. Moreover, the audio processing means 124 in the communication device 110 comprises the audio equalizer (along the lines outlined in the foregoing) for adjusting the frequency content of a sound signal before transferring it via the link 125 to the accessory device 130 for playback via the at least one speaker therein.

Hence, in the fourth example the parameter adjustment procedure involves selecting and setting the audio equalization parameters, and therefore the control parameter database stores in each database entry predefined audio equalization settings assigned for the pair of the accessory type ID and the device type ID of the same database entry. Consequently, the database entry identified on basis of the obtained accessory type ID and the device type ID provides access to the applicable audio equalization settings. The audio control means 122 hence reads the audio equalization settings from the identified database entry and adjusts the audio equalizer to apply the audio equalization settings so obtained.

In case the processing according to the fourth example is applied to the sound signal to played back via the accessory device 130 in a scenario where also the processing according to one of the first, second and third example is applied to the sound signal captured using the microphone in the accessory device 130, a separate audio equalizer (or separate and different audio equalization settings) may be applied for the to-be-played-back sound signal and to the captured sound signal.

After completion of the parameter adjustment procedure, in other words after the at least one operating parameter value in the accessory device 130 and/or in the communication device 110 has been set, the audio control means 122 may store in the communication device 110 (e.g. in the memory 115 or in a mass storage device in the communication device 110) an indication in this regard. This indication may be included e.g. in the database entry of the control parameter database that corresponds to the obtained pair of the accessory type ID and the device type ID.

Subsequently, the communication device 110 may carry out a verification procedure in order to verify correct application of the desired operating parameter values in the accessory device 130 and/or in the communication device 110. The verification procedure involves the audio control means 122 obtaining the accessory type ID assigned for the accessory device 130 connected to communication device 110 and the device type ID assigned for the communication device 110, applying a predefined test sequence associated with the pair of accessory type ID and the device type ID, and storing (e.g. in the memory 115) a verification sequence that results from application of the test sequence. The verification is successful in response to the stored verification sequence matching (or substantially matching) a respective reference sequence, whereas the verification fails in case the stored verification sequences does not match (or does not substantially match) the respective reference sequence.

The predefined test sequences for a plurality of pairs of the accessory type ID and the device type ID together with respective reference sequences may be stored, for example, in a verification database. The verification database may be stored in the memory 115 or in a mass storage device in the communication device 110. Each test sequence comprises one or more test items, while the respective reference sequence comprises respective one or more reference items. Each of the test items may be input, one after another, through a processing path that involves at least those components of the audio transducer means 144 and/or the audio processing means 124 that have been affected by the parameter adjustment procedure to generate a corresponding verification item at the output of the processing path.

In successful verification procedure, at least a predefined amount of test items fulfils predefined verification criteria, e.g. at least the predefined amount of test items results in the corresponding verification items matching (or substantially matching) the respective reference item. Herein, the predefined amount may denote, for example, all test items, a predefined number of test items (that is less than all the test items) or a predefined percentage (that is less than 100%) of the test items. Moreover, the term matching (or substantially matching) as used herein may denote exact match between the verification item and the respective reference item or it may denote a scenario where the difference between the verification item and the respective reference item is smaller than a predefined threshold. The threshold may, for example, indicate maximum allowed difference between the verification item and the respective reference item and/or maximum allowed average difference between the verification item and the respective reference item.

As non-limiting examples in this regards, referring to the first through fourth examples described in the foregoing, the processing path through which the test sequences are processed may involve e.g. one of the following:

- A microphone preamplifier in the audio transducer means 144 in the accessory device 130;
- A microphone preamplifier in the audio processing means 124 in the communication device 110;
- A first amplifier component in the audio transducer means 144 in the accessory device 130 and a second amplifier component in the audio processing means 124 in the communication device 110;
- A microphone preamplifier in the audio transducer means 144 in the accessory device 130 and an audio equalizer in the audio processing means 124 in the communication device 110;
- An audio equalizer in the audio processing means 124 in the communication device 110.

E.g. in context of the first through third examples described in the foregoing, a variation of the verification procedure may involve user-initiated test items instead of predefined test item(s) stored in the verification database. In this regard, the verification procedure may comprise the user device 110 (or the accessory device 130) prompting the user, via the user interface, to input a test item and processing the audio signal captured by the microphone in the audio transducer means 144 in the accessory device 130 though through a processing path that involves at least those components of the audio transducer means 144 and/or the audio processing means 124 that have been affected by the parameter adjustment procedure to generate a corresponding verification item at the output of the processing path. In this scenario, instead of including reference item(s), the verification database may store predefined reference audio characteristics, e.g. reference information that define respective reference value(s) for the signal level at the output of the processing path and/or reference value(s) for the frequency response at the output of the processing path. Consequently, instead of matching the verification items against respective reference items the verification in this regard involves matching the verification items against respective reference audio characteristics. Herein, the user inputted test item may include a predefined or randomly selected sentence uttered by the user or other predefined or randomly selected sound inputted via the microphone in the accessory device 130

The outcome of the verification procedure may be stored in a verification log in the communication device 110, e.g. in the memory 115 or in a mass storage device in the communication device 110. Additionally or alternatively, in indication of the outcome of the verification procedure may be provided to a user of the communication device 110 via the user interface of the communication device 110. Such indication may involve, for example, audible indication via a speaker in the communication device or via a speaker communicatively coupled to the communication device 130. Additionally or alternatively, the indication may involve displaying a notification (including e.g. text and/or an image descriptive of the outcome of the verification procedure) on a display in the communication device 110. In an example, an indication of respective type is provided regardless of the outcome of the verification procedure, such that the indication provided in response to a successful verification is different from that provided in response to an unsuccessful verification. In another example, an indication is provided only in response to an unsuccessful verification.

The verification procedure may be initiated, for example, according to a predefined schedule. The predefined schedule may specify e.g. that the verification is to be repeated at predefined time intervals. Additionally or alternatively, the verification procedure may be initiated in response to a user command received via the user interface of the communication device 110.

The user interface of the communication device 110 may further provide a respective user function for adjusting or re-adjusting one or more of the operating parameters affected by the parameter adjustment procedure. In view of the first to fourth examples provided in the foregoing, as non-limiting examples, such operating parameters may involve one or more of the following:

- the microphone preamplifier gain $g_{mic}$ in the audio transducer means 144 in the accessory device 130;
- the microphone preamplifier gain $g_{mic}$ in the audio processing means 124 in the communication device 110;
- the amplifier gains $g_{mic1}$ and $g_{mic2}$ in the audio transducer means 144 in the accessory device 130 and in the audio processing means 124 in the communication device 110, respectively;
- the audio equalization settings in the audio equalizer of the audio processing means 124 in the communication device 110, either for the sound signal that is to be transferred for playback in the accessory device 130, for the sound signal that is received from the accessory device 140, or both.

Such user functions hence enable the user to replace settings or values for one or more of the operating parameters in the accessory device 130 and/or in the communication device 110 set by operation of the parameter adjustment procedure with respective settings or values he/she prefers. The act of further adjusting an operating parameter that has been set using the parameter adjustment procedure can be referred to as manual override.

In case the manual override is applied to further adjust an operating parameter set by the parameter adjustment procedure, a manual override indication is stored in the respective database entry of the control parameter database. Such indication includes at least the user-adjusted value(s) of the respective operating parameter(s), possibly together with an explicit indication that the manual override has been applied to further adjust the associated operating parameter(s). The manual override indication serves, in one hand, to ensure that the parameter adjustment procedure is not subsequently applied for the respective pair of accessory ID and the device ID but the user-adjusted operating parameter values stored therein are to be applied instead. Moreover, the manual override indication further serves as an indication that the verification procedure is not to be carried out since it is tailored for verification of the corresponding predefined values for the operating parameters and hence running the verification procedure for the user-adjusted values would not, in general case, serve any meaningful purpose.

In an example, operation of an arrangement comprising the mobile communication device 110 that comprises the audio processing means 124 and the accessory device 130 that comprises the audio transducer means 144 described via a number of examples in the foregoing may be formulated as a method for operating such an arrangement. As an example in this regard, FIG. 2 illustrates a method 200, which commences from operating the arrangement where the accessory device 130 is communicatively coupled to the communication device 110, as indicated in block 210. The method 200 further involves adjusting at least one operating parameter in one or both of the audio processing means 124 and the audio transducer means 144, as indicated in block 220. The adjustment of block 220 comprises obtaining, from the accessory device 130, an accessory type identification assigned therefor, as indicated in block 230 and obtaining a device type identification assigned for the communication device 110, as indicated in block 240. The operation of the block 220 further comprises selecting a respective predefined value for each of said at least one operating parameter in dependence of the obtained accessory type identifier and the device type identifier, as indicated in block 250 and setting each of said at least one operating parameter into respective selected values for subsequent operation of the arrangement, as indicated in block 260.

The method 200 may be varied and/or complemented in a number of ways, for example as described in the foregoing in context of examples concerning operational and/or structural characteristics of components of the arrangement comprising the mobile communication device 110 and the accessory device 130.

Referring back to components of the communication device 110 and the accessory device 130, the processor 116, 136 is configured to read from and write to the respective memory 115, 135. Although each of the processors 116, 136 is depicted as a respective single component, any of the processors 116, 136 may be implemented as respective one or more separate processing components. Similarly, although each of the memories 115, 135 is depicted as a respective single component, any of the memories 115, 135 may be implemented as respective one or more separate components, some or all of which may be integrated/removable and/or may provide permanent/semi-permanent/dynamic/cached storage.

The memory 115, 135 may store the respective computer program comprising computer-executable instructions that control the operation of the respective device 110, 130 when loaded into the respective processor 116, 136. As an example, the computer program may include one or more sequences of one or more instructions. Using components of the communication device 110 as an example, the computer program may be provided as part of the computer program code 117. The processor 116 is able to load and execute the computer program by reading the one or more sequences of one or more instructions included therein from the memory 115. The one or more sequences of one or more instructions may be configured to, when executed by the processor 116, cause the communication device 110 to carry out operations, procedures and/or functions described in the foregoing.

Hence, the communication device 110 may comprise at least one processor 116 and at least one memory 115 including the computer program code 117 for one or more programs, the at least one memory 115 and the computer program code 117 configured to, with the at least one processor 116, cause the communication device 110 to perform operations, procedures and/or functions described in the foregoing. Similar considerations are equally valid for corresponding components 135, 136 and 137 of the accessory device 130.

The computer programs stored in any of the memories 115, 135 may be provided e.g. as a respective computer program product comprising at least one computer-readable non-transitory medium having the respective computer program code 117, 137 stored thereon, the computer program code, when executed by the respective device 110, 130, causes the device at least to perform operations, procedures and/or functions described for the respective device 110, 130 in the foregoing. The computer-readable non-transitory medium may comprise a memory device or a record medium such as a CD-ROM, a DVD, a Blu-ray disc or another article of manufacture that tangibly embodies the computer program. As another example, the computer program may be provided as a signal configured to reliably transfer the computer program.

Reference(s) to a processor should not be understood to encompass only programmable processors, but also dedicated circuits such as field-programmable gate arrays (FPGA), application specific circuits (ASIC), signal processors, etc.

Features described in the preceding description may be used in combinations other than the combinations explicitly described. Although functions have been described with reference to certain features, those functions may be performable by other features whether described or not. Although features have been described with reference to certain embodiments, those features may also be present in other embodiments whether described or not.

The invention claimed is:

1. An arrangement of a mobile communication device, comprising:
   an audio processing means, communicatively coupled to an accessory device that comprises an audio transducer means;
   a control means for adjusting at least one operating parameter of the audio processing means and at least one operating parameter of the audio transducer means, the control means arranged to
      obtain, via the communicative coupling from the accessory device, an accessory type identification assigned for the accessory device,
      obtain a device type identification assigned for the mobile communication device,
      select a respective predefined value for each of said at least one operating parameter of the audio processing means and said at least one operating parameter of the audio transducer means in dependence of the pair of obtained accessory type identifier and the device type identifier, and
      set each of said at least one operating parameter into respective selected values for subsequent operation of the arrangement;
   and a verification means for verifying a correct application of selected values for said at least one operating parameter, the verification means arranged to
      select, in dependence of the obtained accessory type identifier and device type identifier, a predefined test sequence of one or more test items and a respective predefined reference sequence of one or more reference items, where the selected predefined test and reference sequences are associated with the pair of obtained accessory type identifier and the device type identifier, and
      verify the correct application of the selected values for said at least one operating parameter using the selected predefined test and reference sequences.

2. The arrangement according to claim 1, wherein said accessory type identification defines at least a manufacturer and a model of the accessory device.

3. The arrangement according to claim 1, wherein said device type identification defines at least a manufacturer and a model of the mobile communication device.

4. The arrangement according to claim 1, wherein the audio transducer means comprises at least one of a microphone and a speaker.

5. The arrangement according to claim 4, wherein said at least one operating parameter of the audio processing means comprises one or more of the following:
   a microphone preamplifier gain to be employed in a microphone preamplifier provided in the audio processing means,
   a first amplifier gain to be employed in a first amplifier component provided in the audio transducer means and a second amplifier gain to be employed in a second amplifier component provided in the audio processing means, and
   audio equalization settings to be employed in an audio equalizer component provided in the audio processing means.

6. The arrangement according to claim 4, wherein said at least one operating parameter of the audio transducer means comprises a microphone preamplifier gain to be employed in a microphone preamplifier provided in the audio transducer means.

7. The arrangement according to claim 1,
   wherein the mobile communication device further comprises a memory means for storing data, arranged to store a control parameter database comprising a plurality of database entries, each database entry pertaining to a predefined pair of accessory type identification and device type identification and comprising an indication of respective values for said at least operating parameter, and
   wherein the control means is arranged to carry out said selecting by
      identifying a database entry of the control parameter database that pertains to the pair of obtained accessory type identification and device type identification, and
      selecting the respective values for said at least one operating parameter values included in the identified database entry.

8. The arrangement according to claim 1, wherein said verification means is further arranged to
   input the one or more test items of the selected test through a processing path that involves at least those components of the audio transducer means and/or the audio processing means that have been affected by the control means via adjusting the at least one operating parameter in one or both of the audio processing means and the audio transducer means to generate corresponding one or more verification items at an output of the processing path, compare the one or more verification items obtained at the output of the processing path to the respective one or more reference items, and indicate successful verification in response to at least a predefined amount of test items fulfilling predefined verification criteria.

9. The arrangement according to claim 2, wherein said device type identification defines at least a manufacturer and a model of the mobile communication device.

10. The arrangement according to claim 2, wherein the audio transducer means comprises at least one of a microphone and a speaker.

11. The arrangement according to claim 3, wherein the audio transducer means comprises at least one of a microphone and a speaker.

12. The arrangement according to claim 5, wherein said at least one operating parameter of the audio transducer means comprises a microphone preamplifier gain to be employed in a microphone preamplifier provided in the audio transducer means.

13. The arrangement according to claim 2,
wherein the mobile communication device further comprises a memory means for storing data, arranged to store a control parameter database comprising a plurality of database entries, each database entry pertaining to a predefined pair of accessory type identification and device type identification and comprising an indication of respective values for said at least operating parameter, and
wherein the control means is arranged to carry out said selecting by
identifying a database entry of the control parameter database that pertains to the pair of obtained accessory type identification and device type identification, and
selecting the respective values for said at least one operating parameter values included in the identified database entry.

14. The arrangement according to claim 3,
wherein the mobile communication device further comprises a memory means for storing data, arranged to store a control parameter database comprising a plurality of database entries, each database entry pertaining to a predefined pair of accessory type identification and device type identification and comprising an indication of respective values for said at least operating parameter, and
wherein the control means is arranged to carry out said selecting by
identifying a database entry of the control parameter database that pertains to the pair of obtained accessory type identification and device type identification, and
selecting the respective values for said at least one operating parameter values included in the identified database entry.

15. The arrangement according to claim 4,
wherein the mobile communication device further comprises a memory means for storing data, arranged to store a control parameter database comprising a plurality of database entries, each database entry pertaining to a predefined pair of accessory type identification and device type identification and comprising an indication of respective values for said at least operating parameter, and
wherein the control means is arranged to carry out said selecting by identifying a database entry of the control parameter database that pertains to the pair of obtained accessory type identification and device type identification, and
selecting the respective values for said at least one operating parameter values included in the identified database entry.

16. The arrangement according to claim 5,
wherein the mobile communication device further comprises a memory means for storing data, arranged to store a control parameter database comprising a plurality of database entries, each database entry pertaining to a predefined pair of accessory type identification and device type identification and comprising an indication of respective values for said at least operating parameter, and
wherein the control means is arranged to carry out said selecting by
identifying a database entry of the control parameter database that pertains to the pair of obtained accessory type identification and device type identification, and
selecting the respective values for said at least one operating parameter values included in the identified database entry.

17. The arrangement according to claim 6,
wherein the mobile communication device further comprises a memory means for storing data, arranged to store a control parameter database comprising a plurality of database entries, each database entry pertaining to a predefined pair of accessory type identification and device type identification and comprising an indication of respective values for said at least operating parameter, and
wherein the control means is arranged to carry out said selecting by
identifying a database entry of the control parameter database that pertains to the pair of obtained accessory type identification and device type identification, and
selecting the respective values for said at least one operating parameter values included in the identified database entry.

18. A method for operating an arrangement of a mobile communication device that incorporates an audio processing means communicatively coupled to an accessory device with an audio transducer means, the method comprising:
adjusting at least one operating parameter of the audio processing means and at least one operating parameter of the audio transducer means, said adjusting comprising
obtaining, via the communicative coupling from the accessory device, an accessory type identification assigned for the accessory device,
obtaining a device type identification assigned for the mobile communication device,
selecting a respective predefined value for each of said at least one operating parameter of the audio processing means and said at least one operating parameter of the audio transducer means in dependence of the pair of obtained accessory type identifier and the device type identifier, and
setting each of said at least one operating parameter into respective selected values for subsequent operation of the arrangement; and verifying a correct application of selected values for said at least one operating parameter, said verifying comprising selecting, in dependence of the obtained accessory type identifier and device type identifier, a predefined test sequence of one or more test items and a respective predefined reference sequence of one or more reference items, where the selected predefined test and reference sequences are associated with the pair of obtained accessory type identifier and the device type identifier, and verifying the correct application of the selected values for said at least one operating parameter using the selected predefined test and reference sequences.

19. A non-transitory computer-readable medium on which is stored a computer program comprising program code configured to cause a computing apparatus to perform the method of claim 18 when said program code is executed on the computing apparatus.

\* \* \* \* \*